US012684825B2

(12) United States Patent
Yang et al.

(10) Patent No.: US 12,684,825 B2
(45) Date of Patent: Jul. 14, 2026

(54) TERMINAL STRUCTURE OF POWER DEVICE AND MANUFACTURING METHOD THEREOF, AND POWER DEVICE

(71) Applicant: Huawei Technologies Co., Ltd., Shenzhen (CN)

(72) Inventors: Wentao Yang, Dongguan (CN); Boning Huang, Dongguan (CN); Qian Zhao, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 479 days.

(21) Appl. No.: 18/192,070

(22) Filed: Mar. 29, 2023

(65) Prior Publication Data

US 2023/0238426 A1     Jul. 27, 2023

Related U.S. Application Data

(63) Continuation of application No. PCT/CN2020/119634, filed on Sep. 30, 2020.

(51) Int. Cl.
*H10D 62/10* (2025.01)
*H10D 64/00* (2025.01)
*H10D 62/17* (2025.01)

(52) U.S. Cl.
CPC ......... *H10D 62/107* (2025.01); *H10D 64/112* (2025.01); *H10D 62/393* (2025.01)

(58) Field of Classification Search
CPC .... H10D 62/107; H10D 62/393; H10D 8/411; H10D 12/038; H10D 12/481; H10D 30/665; H10D 30/668; H10D 62/106; H10D 30/0281–0289; H10D 30/65–659; H10D 64/111–117; H10D 62/60–605
See application file for complete search history.

(56) References Cited

U.S. PATENT DOCUMENTS 4,468,686 A     8/1984  Rosenthal
5,032,878 A     7/1991  Davies et al.
(Continued)

FOREIGN PATENT DOCUMENTS

CN     101740641 A     6/2010
CN     101969069 A     2/2011
(Continued)

OTHER PUBLICATIONS

Lowell E. Clark, et al, "High-Voltage Termination Using Enhanced Surface Doping," International Symposium on Power Semiconductor Devices & ICs, Tokyo, May 19, 1992, XP010584276, 5 pages.

*Primary Examiner* — Shahed Ahmed
(74) *Attorney, Agent, or Firm* — Conley Rose, P.C.

(57) ABSTRACT

A terminal structure of a power device includes a substrate and a plurality of field limiting rings disposed on a first surface of the substrate. The substrate includes a drift layer and a doped layer. The doped layer is formed through diffusion inward from the first surface of the substrate. The doped layer and the drift layer are a first conductivity type, and an impurity concentration of the doped layer is greater than an impurity concentration of the drift layer. The field limiting rings are a second conductivity type. In the terminal structure, lateral diffusion of impurities in the field limiting rings is limited through a design of the doped layer.

20 Claims, 9 Drawing Sheets

(56)                    References Cited

U.S. PATENT DOCUMENTS

| | | | |
|---|---|---|---|
| 5,075,739 A * | 12/1991 | Davies ................. | H10D 64/112 |
| | | | 257/E29.013 |
| 2008/0169526 A1 | 7/2008 | Wakimoto et al. | |
| 2011/0204469 A1 | 8/2011 | Onishi | |
| 2013/0037851 A1 * | 2/2013 | Gejo .................... | H10D 12/461 |
| | | | 257/493 |
| 2013/0214394 A1 | 8/2013 | Senoo | |
| 2013/0264674 A1 | 10/2013 | Mizushima | |
| 2014/0374774 A1 | 12/2014 | Tanaka et al. | |

FOREIGN PATENT DOCUMENTS

| | | | |
|---|---|---|---|
| CN | 103367398 A | 10/2013 | |
| CN | 103534809 A | 1/2014 | |
| CN | 104332491 A | 2/2015 | |
| CN | 104600103 A | 5/2015 | |
| JP | H08167617 A | 6/1996 | |
| JP | H10270370 A | 10/1998 | |
| JP | 2007266520 A | 10/2007 | |
| JP | 2009117715 A | 5/2009 | |
| JP | 5277882 B2 | 8/2013 | |
| WO | 2009039014 A1 | 3/2009 | |
| WO | 2012081664 A1 | 6/2012 | |
| WO | 2014087601 A1 | 6/2014 | |

* cited by examiner

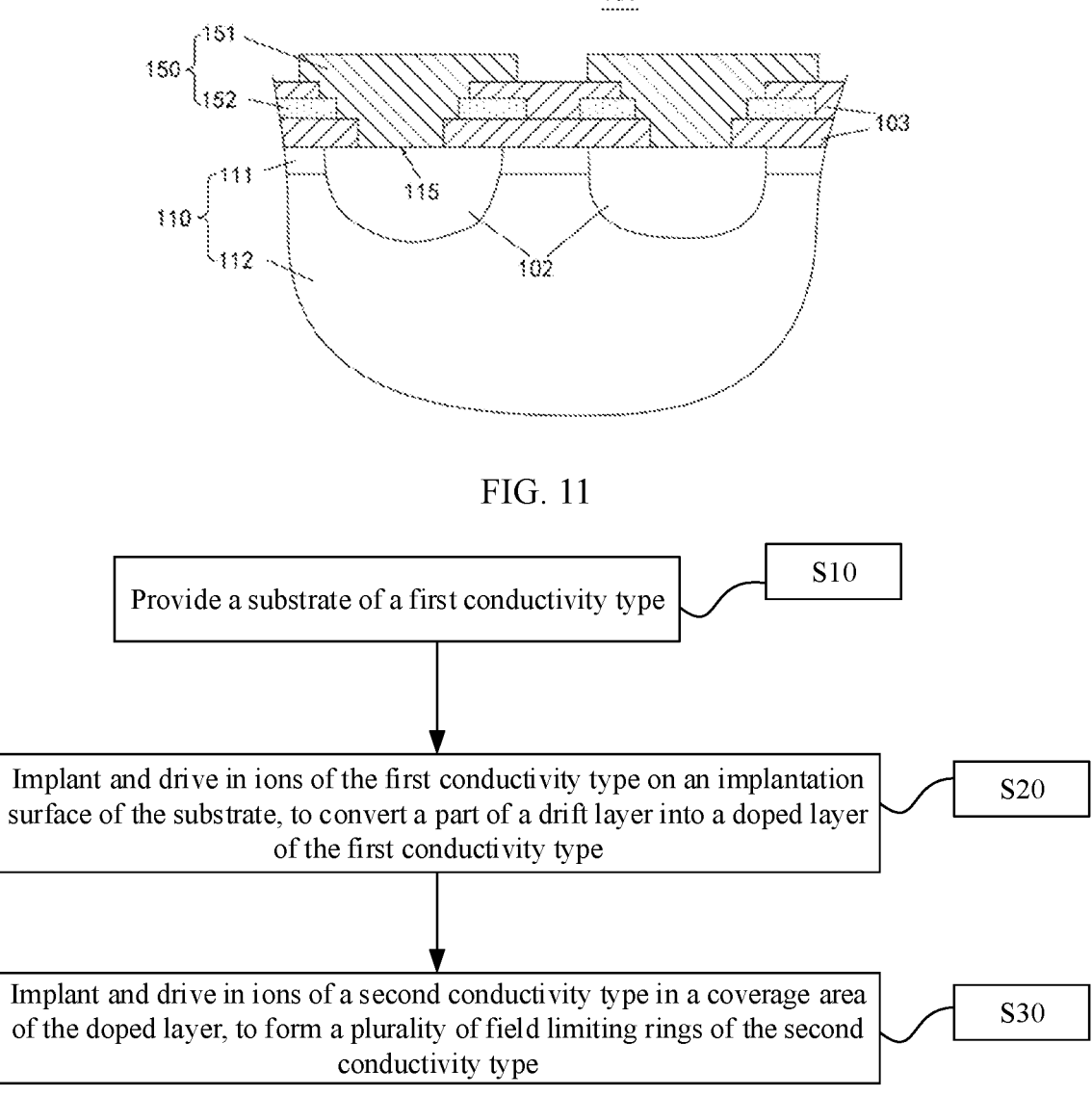

FIG. 11

| Provide a substrate of a first conductivity type | S10 |

| Implant and drive in ions of the first conductivity type on an implantation surface of the substrate, to convert a part of a drift layer into a doped layer of the first conductivity type | S20 |

| Implant and drive in ions of a second conductivity type in a coverage area of the doped layer, to form a plurality of field limiting rings of the second conductivity type | S30 |

FIG. 12

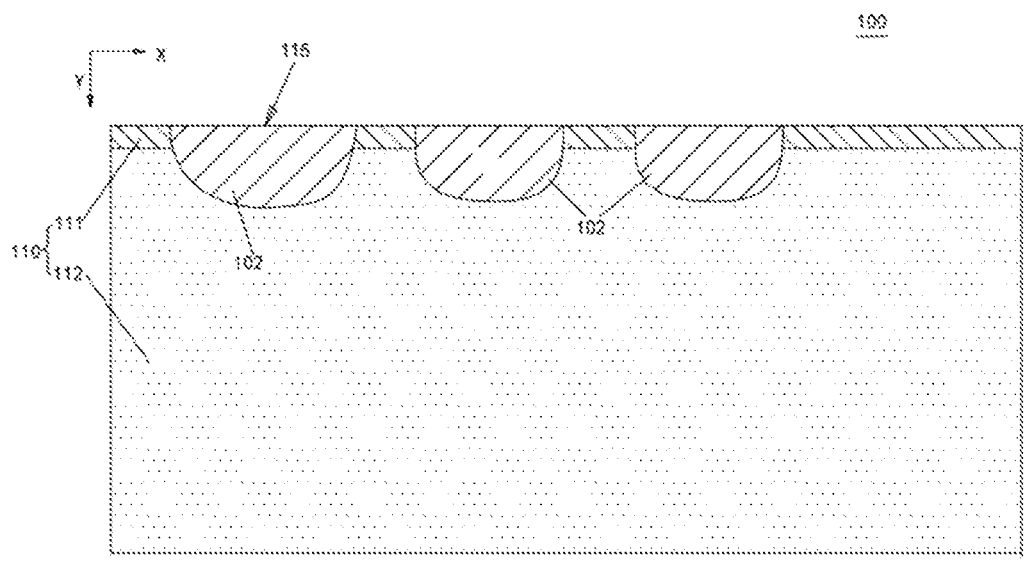

FIG. 15

```
┌──────────────────────────────┐        ┌────────┐
│   Provide a substrate of a first │ ─────  │  S10   │
│        conductivity type      │        └────────┘
└──────────────────────────────┘
                │
                ▼
┌──────────────────────────────────────────┐    ┌────────┐
│  Implant and drive in ions of the first conductivity type on an │ ─── │  S20   │
│ implantation surface of the substrate, to convert a part of a drift layer │    └────────┘
│       into a doped layer of the first conductivity type        │
└──────────────────────────────────────────┘
                │
                ▼
┌──────────────────────────────────────────┐    ┌────────┐
│  Implant and drive in ions of a second conductivity type in a coverage │ ─── │  S30   │
│   area of the doped layer, to form a plurality of field limiting rings of │    └────────┘
│                 the second conductivity type                  │
└──────────────────────────────────────────┘
                │
                ▼
┌──────────────────────────────────────────┐    ┌────────┐
│ Dispose a field oxide layer on the implantation surface, form a cutoff │ ─── │  S40   │
│ ring on an outermost side of the substrate, and dispose a field plate on │    └────────┘
│   a side, of the field oxide layer, that is away from the implantation   │
│                             surface                            │
└──────────────────────────────────────────┘
```

FIG. 16

TERMINAL STRUCTURE OF POWER DEVICE AND MANUFACTURING METHOD THEREOF, AND POWER DEVICE

CROSS-REFERENCE TO RELATED APPLICATIONS

This application is a continuation of International Patent Application No. PCT/CN2020/119634 filed on Sep. 30, 2020, the disclosure of which is hereby incorporated by reference in its entirety.

TECHNICAL FIELD

The present disclosure relates to the field of power device technologies, and in particular, to a terminal structure of a power device and a manufacturing method thereof, and a power device.

BACKGROUND

A power device, also referred to as a power electronic device, is mainly configured to efficiently transmit and convert electric energy for an electrical device, and perform effective and accurate control in these processes. In the past decades since a thyristor was invented in the 1950s, break-throughs were made in physical and process technologies of the power device, and therefore the power device achieved rapid development. The power device has developed from a gate turn-off (GTO) thyristor and a power bipolar junction transistor (BJT) to a power metal-oxide-semiconductor field-effect transistor (MOSFET), a static induction transistor (SIT) and static induction thyristor (SITH), an insulated-gate bipolar transistor (IGBT), a power integrated circuit (PIC), and the like, has an operating frequency within a range of 50 hertz (Hz) to 100 kilohertz (kHz), and is widely used in industries such as aerospace, rail transportation, new energy vehicles, smart grids, and smart home appliances.

A major feature of the power device is a capability of withstanding a quite high voltage. However, during actual manufacturing in a process, a lattice at an edge of a chip is damaged when the chip is cut from a wafer, causing a large leakage current during application of the device, and reducing reliability of the device. In addition, lateral diffusion occurs during actual doping of impurities. As a result, a P-type and N-type (PN) junction is not an ideal parallel planar junction, but is a cylindrical junction or a spherical junction. A curvature effect makes uniform distribution of electric field lines become centralized. As a result, a local electric field finally reaches a critical electric field, causing breakdown. To resolve these problems, a junction terminal technology is proposed, and a special terminal structure is designed at an edge of a device to ensure that the device reaches a specific withstanding voltage level.

Currently, a most widely used junction terminal structure is a plurality of floating field limiting rings disposed on an outer side of a main junction of a power device. In a terminal structure designed with a field limiting ring, a depletion layer of a main junction extends to the field limiting ring due to an increase of a reversed bias voltage. In this case, the field limiting ring diffuses the original depletion layer, and diffusion of impurities in the field limiting ring is also aggravated. It may be understood that the diffusion includes both lateral diffusion and vertical diffusion. This causes an increase of a size of the field limiting ring in a lateral direction, that is, causes an increase of a size of an entire product.

SUMMARY

The present disclosure provides a terminal structure of a power device. A doped layer of a same conductivity type as that of a drift layer is added to a surface of a side, on a substrate, on which a field limiting ring is disposed, to limit lateral diffusion of impurities in the field limiting ring, reduce impact of a charge, and improve reliability of performance of the terminal structure.

According to a first aspect, the present disclosure provides a terminal structure of a power device, including a substrate and a plurality of field limiting rings disposed on a first surface of the substrate. The substrate includes a drift layer and a doped layer. The doped layer is formed through diffusion inward from the first surface of the substrate. The doped layer and the drift layer belong to a first conductivity type, and an impurity concentration of the doped layer is greater than an impurity concentration of the drift layer. The field limiting rings belong to a second conductivity type. The terminal structure may be used in a plurality of types of power devices, and voltage levels of the power devices are high. For example, voltage levels of a power MOSFET, a fast recovery diode, an IGBT, a reverse-conducting IGBT, a superjunction IGBT, and a superjunction reverse-conducting IGBT exceed 400 volts (V). For the foregoing power devices with high voltage levels, a field limiting ring is disposed in a design of a terminal structure of the power devices to increase a breakdown voltage of the power devices. It may be understood that the terminal structure provided in the present disclosure mainly includes the substrate and the plurality of field limiting rings disposed on the first surface of the substrate. Herein, the field limiting rings are designed to diffuse a depletion region of a main junction in the power device, to increase a breakdown voltage of the power device. A quantity of field limiting rings is selected based on a specific situation. Usually, a larger quantity of field limiting rings corresponds to a larger diffusion range of the diffused depletion region, and correspondingly, the breakdown voltage of the power component also increases. Different from a conventional design, the substrate in the present disclosure not only includes the drift layer (the aforementioned depletion region is located in the drift layer), but also includes the doped layer located on a same side as that of the field limiting rings. It should be noted that a conductivity type of the doped layer is the same as a conductivity type of the drift layer, and is opposite to a conductivity type of the field limiting rings, and an impurity concentration of the doped layer is greater than an impurity concentration of the drift layer. For ease of understanding, an N-type substrate is used for description herein. The N-type substrate is usually obtained by doping a silicon semiconductor material with a pentavalent element (phosphorus, arsenic, antimony, or the like), to obtain a semiconductor that conducts electricity mainly by using electrons carrying negative charges. A plurality of field limiting rings are further disposed on a first surface of the N-type substrate. A design of the field limiting rings may be simply understood as an ion implantation process. In an embodiment, ions are implanted at locations, on the first surface of the N-type substrate, at which the field limiting rings need to be disposed. It should be noted that, in this case, the implanted ions are a trivalent element (boron, indium, aluminum, or the like), and correspondingly, P-type field limiting rings are formed. In addition, the N-type substrate in the present disclosure includes a drift layer and a doped layer that have different impurity concentrations (concentrations of implanted ions), where an impurity concentration (i.e., a concentration of ions such as phosphorus, arsenic, or antimony) of the doped layer is greater than an impurity concentration (i.e., a concentration of ions such as phosphorus, arsenic, or antimony) of the drift layer. It may be understood that a key point of the solution of the present disclosure is a design of the doped layer. With the design of the doped layer, a concentration of N-type impurities in a region, on the substrate, that is close to the first surface is increased, thereby inhibiting lateral diffusion of impurities in the P-type field limiting rings, and helping reduce a lateral size of the terminal structure in the case of a same breakdown voltage. In addition, the concentration of the N-type impurities in the region close to the first surface is increased, thereby reducing impact of external charges on a depletion region of the P-type field limiting rings, and improving reliability of the power device.

In a possible implementation, the impurity concentration of the doped layer is less than an impurity concentration of the field limiting rings. For ease of understanding, an implementation of an N-type substrate is used for description herein. When the substrate is an N-type substrate, corresponding field limiting rings belong to a P-type, an impurity concentration of the field limiting rings is a concentration of trivalent boron ions, a corresponding doped layer belongs to an N-type, and an impurity concentration of the doped layer is a concentration of pentavalent phosphorus ions. In this embodiment, the P-type field limiting rings are disposed, causing a change of a main junction depletion region corresponding to a main junction in the power device. To make the main junction depletion region of the main junction extend to the field limiting rings under the action of a bias voltage, an impurity concentration of the field limiting rings usually needs to be higher than an impurity concentration of a drift layer in the substrate, so that the field limiting rings can diffuse the main junction depletion region. In this embodiment, the design of the doped layer in the substrate is merely intended to inhibit lateral diffusion of impurities in the field limiting rings, but not to avoid lateral diffusion of impurities in the field limiting rings. Therefore, an impurity concentration of the N-type doped layer needs to be less than an impurity concentration of the P-type field limiting rings.

In a possible implementation, the impurity concentration of the doped layer is $10^{13}$/cubic centimeters ($cm^3$) to $10^{15}$/$cm^3$. In this implementation, the impurity concentration of the doped layer is $10^{13}$/$cm^3$ to $10^{15}$/$cm^3$. If the impurity concentration of the doped layer is less than $10^{13}$/$cm^3$, an effect of inhibiting, by the doped layer, lateral diffusion of impurities in the field limiting rings is weakened, or even can be ignored. In this case, a design objective of the present disclosure cannot be achieved.

In a possible implementation, a junction depth of the doped layer is less than a junction depth of the field limiting rings. The junction depth is a distance between a surface of the semiconductor and a location, in the depletion region, at which an impurity concentration is equal to an impurity concentration of the substrate. It may be understood that the junction depth of the doped layer is a thickness from the first surface to a boundary surface between the doped layer and the drift layer. Beyond this thickness, an impurity concentration changes to the impurity concentration of the drift layer in the substrate. The junction depth of the field limiting rings may be understood as follows: During manufacturing of the field limiting rings, ions are implanted into the substrate from the first surface and then diffuse at a specific high temperature. Therefore, in the depletion region corresponding to the field limiting rings, a larger distance from the first surface indicates a lower impurity concentration (diffusion is performed from a region with a higher concentration to a region with a lower concentration). When a corresponding impurity concentration decreases to be the same as the impurity concentration of the substrate, it may be understood that a distance from the first surface herein is the junction depth of the field limiting rings. Therefore, in this embodiment, the junction depth of the doped layer is less than the junction depth of the field limiting rings, so that a depth of the field limiting rings in a direction away from the first surface is greater than a depth of the doped layer. In this way, the design of the doped layer does not affect vertical diffusion of impurities in the field limiting rings. In the solution of the present disclosure, the doped layer is used to inhibit lateral diffusion of impurities in the field limiting rings. However, vertical diffusion (in a direction away from the first surface) of impurities does not need to be limited by the doped layer. Therefore, a vertical depth of the field limiting rings needs to be greater than a vertical depth of the doped layer herein, to prevent the doped layer from hindering connection between depletion regions corresponding to adjacent field limiting rings and further affecting a breakdown voltage.

In a possible implementation, a range of the junction depth of the doped layer is 3 micrometers (μm) to 5 μm, and a range of the junction depth of the field limiting rings is 5 μm to 15 μm. In this embodiment, the selection of the ranges of the junction depths of the doped layer and the field limiting rings enables the doped layer to limit lateral diffusion of impurities in the field limiting rings, and also prevents the doped layer from limiting vertical diffusion of impurities in the field limiting rings.

In a possible implementation, the terminal structure further includes a field oxide layer, the field oxide layer is disposed on the first surface, and the field limiting rings are connected to the field oxide layer. In this embodiment, an objective of disposing the field oxide layer on the first surface is to form an isolating layer. In this embodiment, the field oxide layer is formed on the substrate to isolate a semiconductor device, and a thickness of the field oxide layer is usually large, to shield a surface leakage current of the terminal structure, thereby preventing a performance failure of the power device caused by the surface leakage current.

In a possible implementation, the terminal structure further includes a field plate, and the field plate is disposed on a side, of the field oxide layer, that is away from the first surface. In this embodiment, the field plate is disposed on the side, of the field oxide layer, that is away from the first surface. In an embodiment, the field plate is a layer of metal deposited on the field oxide layer. When a PN junction formed by the substrate and the field limiting rings in the terminal structure is reverse-biased, a new electric field peak value is introduced at an end of the field plate, to weaken a main junction electric field, and increase a breakdown voltage of the terminal structure.

In a possible implementation, the terminal structure further includes a cutoff ring of the first conductivity type, and the cutoff ring is located at an outer edge of the substrate. In this embodiment, the cutoff ring is disposed at the outer edge of the substrate, to avoid inversion on a surface of the terminal structure. During manufacturing and packaging of the power device, the field oxide layer on the first surface of the substrate is likely to produce or introduce surface charges (including fixed charges and movable charges). When a quantity of surface charges reaches a specific value, a carrier may be induced on the first surface of the substrate. In addition to depletion, inversion may further occur on the first surface. If inversion occurs, a surface conducting channel is formed between an active region of the substrate and a scribe line, seriously affecting performance of the device or even causing a failure of the device.

In a possible implementation, the first conductivity type is an N-type, and the second conductivity type is a P-type; or the first conductivity type is a P-type, and the second conductivity type is an N-type. In this embodiment, there are two conductivity types. One conductivity type is the N-type, that is, a conducting carrier is a free electron. The other conductivity type is the P-type, that is, a conducting carrier is a hole (a positive charge). The two different conductivity types are formed because different elements are implanted. The substrate is used as an example. If the substrate is an N-type substrate, the substrate is doped with a pentavalent phosphorus, arsenic, or antimony element, and in this case, a carrier that generates a current in the N-type substrate is a freely moving electron. If the substrate is a P-type substrate, the substrate is doped with a trivalent boron, indium, or aluminum element, and in this case, a carrier that generates a current in the P-type substrate is a hole. It may be understood that selection of a specific type of a carrier in the substrate, the field limiting rings, and another structure is not limited in the technical solution of the present disclosure. In the technical solution, an N-type substrate may be combined with P-type field limiting rings, or a P-type substrate may be combined with N-type field limiting rings. A specific solution may be selected according to an actual requirement.

According to a second aspect, the present disclosure further provides a power device. The power device includes a collector layer and/or a buffer layer, and the terminal structure in the foregoing embodiment. The buffer layer and/or the collector layer are located on a second surface of the substrate. It may be understood that, in a power device in which the terminal structure provided in the present disclosure is used, a doped layer is designed on a substrate, and therefore lateral diffusion of impurities in field limiting rings can be effectively limited, and a design size of the terminal structure can still be effectively reduced when a bias voltage is high, thereby reducing a design size of the power device. It may be understood that a power device in which the terminal structure in the present disclosure may be used includes a power MOSFET, a fast recovery diode, an IGBT, a reverse-conducting IGBT (RC-IGBT), a superjunction IGBT (SJ-IGBT), a superjunction reverse-conducting IGBT (SJ-RC-IGBT), and the like. In this embodiment, the collector layer and/or the buffer layer are disposed on the second surface of the substrate. The buffer layer herein may also be understood as a field cutoff layer, and is configured to cut off an electric field. In the case of a same breakdown voltage, the power device provided with the buffer layer has a thinner substrate, thereby achieving a smaller conduction voltage drop and a smaller switching loss. The collector layer herein is configured to provide hole injection.

According to a third aspect, the present disclosure further provides a manufacturing method for a terminal structure of a power device, specifically including the following steps: providing a substrate of a first conductivity type, where the substrate includes a drift layer; implanting and driving in ions of the first conductivity type on a first surface of the substrate, to convert a part of the drift layer into a doped layer of the first conductivity type; and implanting and driving in ions of a second conductivity type in a coverage area of the doped layer, to form a plurality of field limiting rings of the second conductivity type. A difference between the manufacturing method for a terminal structure in the present disclosure and a conventional manufacturing process lies in manufacturing of a doped layer. In the manufacturing method in the present disclosure, a substrate with a specific doping concentration is first selected, and then conducting ions of a same type are implanted and driven-in on a first surface of the substrate. Through secondary ion implantation, a concentration of conducting ions in a drift layer, in the substrate, that is close to the first surface is increased, to form a doped layer. It may be understood that the secondary ion implantation makes an impurity concentration of the doped layer greater than an impurity concentration of a drift layer that is away from the first surface. Finally, through the second-time ion implantation, conducting ions of different types are implanted and driven-in in a required region on the first surface, to form field limiting rings that extend from the first surface to the drift layer. It may be understood that the second-time implantation of different types of conducting ions is a process performed after the doped layer is formed, that is, proper locations are selected on the doped layer for manufacturing the field limiting rings. Compared with conventional manufacturing, in the solution of the present disclosure, before processing of the field limiting rings, a same type of conducting ion is implanted into a drift layer in a region near the first surface, so that the drift layer in the region is converted into a doped layer with a higher doping concentration. In this way, in a subsequent manufacturing process of the field limiting rings, an implantation process of the field limiting rings starts from the doped layer, and diffusion is also performed from the doped layer to the drift layer during diffusion and drive-in of conducting ions of the field limiting rings. Because an impurity concentration of the doped layer formed through implantation is greater than an impurity concentration of the drift layer, implantation and drive-in for the field limiting rings are affected to some extent. Specific impact lies in that the doped layer limits lateral diffusion of impurities in the field limiting rings. In the terminal structure obtained by using the foregoing manufacturing method, the doped layer is designed, and therefore lateral diffusion of impurities in the field limiting rings is limited to some extent, thereby reducing a lateral spacing between a plurality of field limiting rings. This reduces a size of the terminal structure while ensuring a same breakdown voltage, thereby facilitating a miniaturization design of the power device. In addition, the doped layer whose impurity concentration is greater than that of the drift layer is located in the region near the first surface. This can reduce impact of external negative charges of the first surface on the field limiting rings, thereby improving reliability of the entire power device.

In a possible implementation, implantation energy for forming the doped layer is 1 kiloelectronvolt (keV) to 2000 keV, an implantation dose is $10^{11}$ to $10^{14}$ atoms/square centimeters $(cm^2)$, and a drive-in temperature is 900 degrees Celsius (° C.) to 1150° C. In this embodiment, the implantation energy for the doped layer is 1 keV to 2000 keV, the implantation dose is $10^{11}$ to $10^{14}$ atoms/$cm^2$, and the drive-in temperature is 900° C. to 1150° C. This can ensure that the impurity concentration of the doped layer is $10^{13}$/$cm^3$ to $10^{15}$/$cm^3$.

In a possible implementation, the impurity concentration of the doped layer is less than an impurity concentration of the field limiting rings. For ease of understanding, an implementation of an N-type substrate is used for description herein. When the substrate is an N-type substrate, corresponding field limiting rings belong to a P-type, an impurity concentration of the field limiting rings is a doping concentration of trivalent boron, indium, or aluminum, a corresponding doped layer belongs to an N-type, and an impurity concentration of the doped layer is a doping concentration of pentavalent phosphorus, arsenic, or antimony. In this embodiment, the P-type field limiting rings are disposed, causing a change of a main junction depletion region corresponding to a main junction in the power device. To make the main junction depletion region of the main junction extend to the field limiting rings under the action of a bias voltage, an impurity concentration of the field limiting rings usually needs to be higher than an impurity concentration of a drift layer in the substrate, so that the field limiting rings can diffuse the main junction depletion region. In this embodiment, the design of the doped layer in the substrate is merely intended to inhibit lateral diffusion of impurities in the field limiting rings, but not to avoid lateral diffusion of impurities in the field limiting rings. Therefore, an impurity concentration of the N-type doped layer needs to be less than an impurity concentration of the P-type field limiting rings.

In a possible implementation, a junction depth of the doped layer is less than a junction depth of the field limiting rings. The junction depth of the field limiting rings is greater than the junction depth of the doped layer, to prevent the doped layer from hindering connection between depletion regions corresponding to adjacent field limiting rings and further affecting a magnitude of a breakdown voltage.

In a possible implementation, a range of the junction depth of the doped layer is 3 $\mu$m to 5 $\mu$m, and a range of the junction depth of the field limiting rings is 5 $\mu$m to 15 $\mu$m. In this embodiment, the selection of the ranges of the junction depths of the doped layer and the field limiting rings enables the doped layer to limit lateral diffusion of impurities in the field limiting rings, and also prevents the doped layer from limiting vertical diffusion of impurities in the field limiting rings.

In a possible implementation, the manufacturing method for a terminal structure further includes the following steps: disposing a field oxide layer on the first surface; forming a cutoff ring of the first conductivity type on an outermost side of the substrate; and disposing a field plate on a side, of the field oxide layer, that is away from the first surface. In this embodiment, the field oxide layer, the cutoff ring, and the field plate are further disposed on the substrate. These structures are designed to increase a withstanding voltage of the terminal structure and avoid an excessively large leakage current of the terminal structure.

In a possible implementation, the first conductivity type is an N-type, and the second conductivity type is a P-type; or the first conductivity type is a P-type, and the second conductivity type is an N-type. In the manufacturing method for a terminal structure, a main operation is to perform secondary ion implantation on a substrate that includes ions of a specific conductivity type. A specific requirement is imposed on conductivity types of conducting ions that are implanted at two times. For example, if ions implanted into the substrate are a pentavalent element (phosphorus, arsenic, antimony, or the like), the substrate is an N-type substrate, and an internal carrier is a free electron. In this case, ions implanted at the first time are also a pentavalent element, to form an N-type doped layer with a higher impurity concentration. Finally, ion implantation is performed by using a trivalent element (boron, aluminum, or the like), to form P-type field limiting rings. In the foregoing example, alternatively, the substrate may be first changed into a P-type substrate, and a P-type doped layer and N-type field limiting rings are correspondingly obtained. This may be selected according to an actual requirement, and is not specifically limited.

In the terminal structure of a power device in the present disclosure, a doped layer with a higher impurity concentration is disposed on a first surface of an original drift layer. By using a feature that an impurity concentration of the doped layer is higher, a range of impurity diffusion in field limiting rings in an original terminal structure is changed, and in particular, lateral diffusion of impurities in the field limiting rings is limited, thereby reducing a spacing between a plurality of field limiting rings, and implementing a small-size design of the terminal structure. For a power device with the terminal structure, a size of the power device is reduced while a requirement for a bias voltage and the like is met, thereby facilitating a miniaturization design of the power device.

BRIEF DESCRIPTION OF DRAWINGS

To describe technical solutions in embodiments of the present disclosure or in the background more clearly, the following describes accompanying drawings used in embodiments of the present disclosure or in the background.

FIG. 11 is a schematic diagram of a structure of a field plate in a terminal structure of a power device according to an embodiment of the present disclosure;

FIG. 12 is a diagram of a process of a manufacturing method for a terminal structure of a power device according to an embodiment of the present disclosure;

FIG. 15 is a schematic diagram of step S30 in a manufacturing method for a terminal structure of a power device according to an embodiment of the present disclosure;

FIG. 16 is a diagram of another process of a manufacturing method for a terminal structure of a power device according to an embodiment of the present disclosure.

DESCRIPTION OF EMBODIMENTS

For a clearer understanding of technical features, purposes, and effects of the present disclosure, specific embodiments of the present disclosure are described herein in detail with reference to accompanying drawings.

To make a person skilled in the art better understand solutions of the present disclosure, the following describes embodiments of the present disclosure with reference to accompanying drawings in embodiments of the present disclosure.

Figure 1:
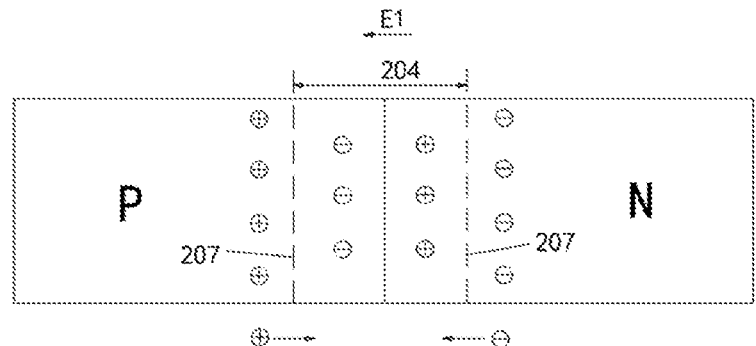
FIG. 1 is a schematic diagram of ion motion of a PN junction.
Figure 2:
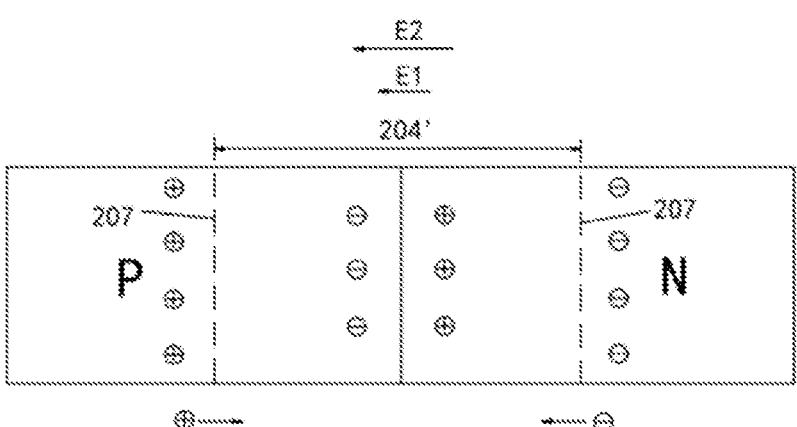
FIG. 2 is a schematic diagram of ion motion of a PN junction under the action of an external electric field.
Figure 3:
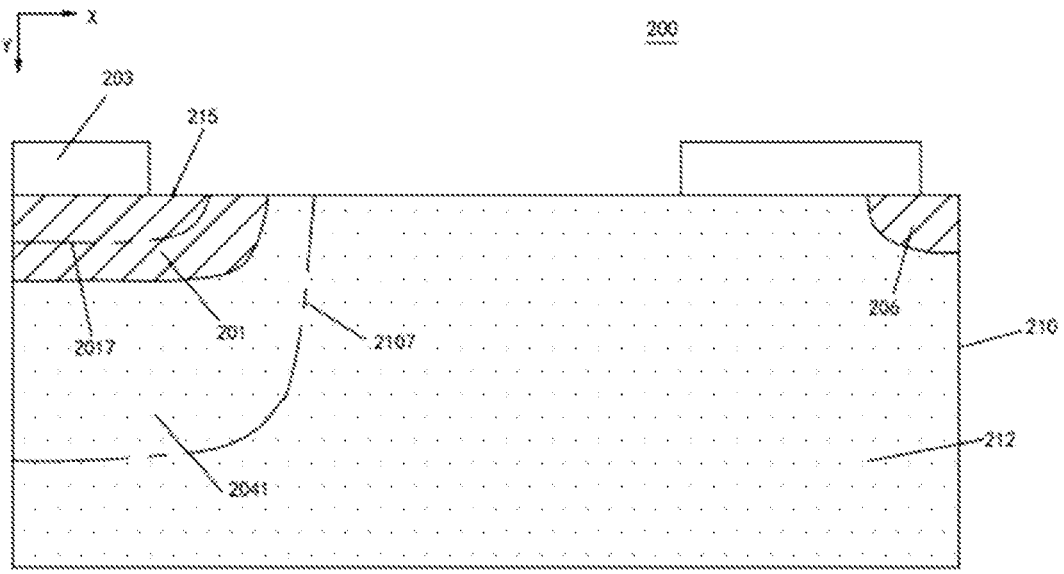
FIG. 3 is a schematic diagram of a structure of a terminal structure of a power device without a field limiting ring in the conventional technology.

Refer to all of FIG. 1, FIG. 2, and FIG. 3. FIG. 1 and FIG. 2 are schematic diagrams of forming a depletion region in a PN junction, and FIG. 3 is a schematic diagram of a structure of a terminal structure 200 in a conventional power device. First, FIG. 1 to FIG. 3 are used below for description, to help better understand technical solutions of the present disclosure.

FIG. 1 is a schematic diagram of forming a depletion region in a PN junction in a normal case. In the figure, a semiconductor on the left is doped with a small quantity of impurity elements (e.g., indium or boron) to form a P-type semiconductor, and a semiconductor on the right is doped with a small quantity of impurity elements (e.g., phosphorus or germanium) to form an N-type semiconductor. In the P-type semiconductor, an original semiconductor atom (e.g., a silicon atom) is replaced with an impurity atom. Boron is as an example. A hole is generated when three outer electrons at an outer layer of a boron atom form a covalent bond with surrounding silicon atoms. In this way, this type of semiconductor has a high hole (equivalent to a positive charge) concentration, and therefore becomes a material capable of conduction. Likewise, in the N-type semiconductor, a semiconductor atom (e.g., a silicon atom) is replaced with an impurity atom. Phosphorus is used as an example. Four of five outer electrons of the phosphorus atom form a covalent bond with surrounding semiconductor atoms, and the extra electron is almost not bound, and is likely to become a free electron. Therefore, the N-type semiconductor becomes a semiconductor with a high electron concentration, and conductivity of the N-type semiconductor is mainly based on conduction of the free electron.

After the P-type semiconductor and the N-type semiconductor are combined as shown in FIG. 1, in an N-type region, a free electron is a majority carrier, and there is almost no hole and therefore a hole is referred to as a minority carrier; and in a P-type region, a hole is a majority carrier, and a free electron is a minority carrier. Therefore, differences between concentrations of electrons and between concentrations of holes occur at a boundary between the N-type region and the P-type region. Due to differences between concentrations of free electrons and between concentrations of holes, as indicated by arrow directions for a positive charge (namely, a hole) and a negative charge (namely, a free electron) in the PN junction in FIG. 1, some electrons diffuse from the N-type region to the P-type region, and some holes need to diffuse from the P-type region to the N-type region. As a result of the diffusion of the electrons and the holes, in the P-type region, holes are lost, and impurity ions carrying negative charges are retained;

and in the N-type region, electrons are lost, and impurity ions carrying positive charges are retained. Ions in an open-circuit semiconductor cannot move freely, and therefore do not participate in conduction. These immovable charged particles form a depletion region 204 near a boundary between the P-type semiconductor and the N-type semiconductor. Corresponding depletion boundaries 207 are respectively located in the P-type semiconductor and the N-type semiconductor. Correspondingly, these immovable charged particles form an internal electric field E1 in the depletion region 204. Under the action of the internal electric field E1, impurity ions overcome a concentration-based diffusion effect and achieve a steady-state equilibrium.

As shown in FIG. 2, an external reversed bias voltage E2 is applied to the PN junction. To be specific, the P-type semiconductor is connected to a negative electrode, and the N-type semiconductor is connected to a positive electrode. In this case, under the action of the reversed bias voltage E2, the original equilibrium is broken. It may be understood that diffusion of corresponding impurity ions is further aggravated to overcome the action of the internal electric field E1 in combination with the reversed bias voltage E2. By comparing FIG. 2 and FIG. 1, it can be learned that a range of the depletion region 204 in FIG. 2 is increased due to existence of the reversed bias voltage E2. It may be understood that as the reversed bias voltage E2 increases, the depletion region 204 is further expanded until the reversed bias voltage E2 reaches an upper limit (namely, a breakdown voltage).

After an operating principle of the PN junction is understood, the following describes a conventional technical solution. FIG. 3 shows a terminal structure 200 without a field limiting ring, and FIG. 4 shows a terminal structure 200 including a plurality of field limiting rings 202.

In FIG. 3, the terminal structure 200 of a power device includes a substrate 210 and an oxide layer 203 disposed on the substrate 210, where the oxide layer 203 has a plurality of openings. It may be understood that the substrate 210 is a semiconductor carrying conducting ions, that is, one of an N-type semiconductor or a P-type semiconductor. For ease of description, an example in which the substrate 210 is an N-type semiconductor is used for description herein. It should be noted that, herein, a region, on the substrate 210, in which no main junction 201 is disposed is a drift layer 212 (a dotted shadow region in the figure). In this case, a free electron in the substrate 210 is a majority carrier, that is, a majority carrier in the drift layer 212 is a free electron. Correspondingly, the main junction 201 is a P-type semiconductor, and an internal hole of the main junction 201 is a majority carrier. With reference to the descriptions of FIG. 1, it can be learned that the main junction 201 and the drift layer 212 form a typical PN junction in this case. Under the action of an impurity concentration difference and an internal electric field, a main junction depletion region 2041 is formed, and a corresponding depletion boundary 2017 and depletion boundary 2107 are formed in the main junction 201 and the drift layer 212, respectively.

Figure 4:
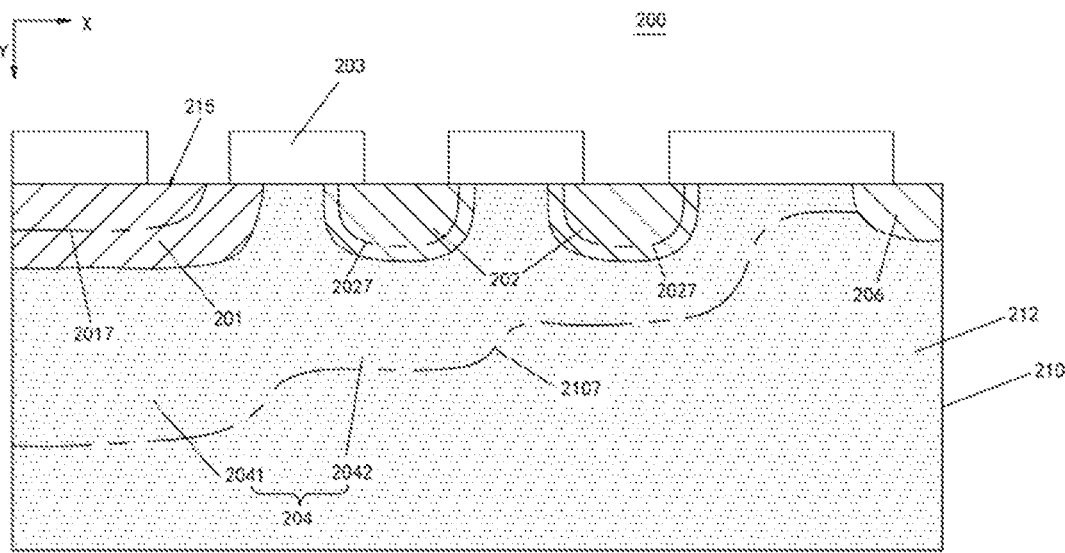
FIG. 4 is a schematic diagram of a structure of a terminal structure of a power device with a field limiting ring in the conventional technology.

As shown in FIG. 4, different from the terminal structure 200 in FIG. 3, the terminal structure 200 in FIG. 4 further includes the plurality of field limiting rings 202 disposed on a first surface 215. When a reversed bias voltage is applied between the main junction 201 and the substrate 210, a range of the main junction depletion region 2041 is increased, and in particular, the depletion boundary 2107 diffuses outward. A diffusion trend herein includes vertical diffusion and lateral diffusion. The vertical diffusion is diffusion in a direction away from the first surface 215, that is, a Y direction indicated by an arrow in the figure. The lateral diffusion is diffusion in a direction parallel to the first surface 215, that is, an X direction indicated by an arrow in the figure. Likewise, a region other than the main junction 201 and the field limiting rings 202 on the substrate 210 is a drift layer 212 (a dotted shadow region in the figure). As the reversed bias voltage increases, the depletion boundary 2107 diffuses to the field limiting rings 202. The field limiting rings 202 are also P-type semiconductors, and internal holes of the field limiting rings 202 are majority carriers. Correspondingly, the field limiting rings 202 and the drift layer 212 also form a PN junction, and a field limiting ring depletion region 2042 corresponding to the field limiting rings 202 is formed. When the main junction depletion region 2041 diffuses to the field limiting ring depletion region 2042 corresponding to the field limiting rings 202 because the reversed bias voltage keeps increasing, the main junction depletion region 2041 and the field limiting ring depletion region 2042 are connected to form a new depletion region 204. That is, as shown in FIG. 4, the depletion region 204 also includes some field limiting rings 202, so that the main junction 201 and the drift layer 212 can withstand a higher reversed bias voltage. It may be understood that the field limiting rings 202 are disposed, so that a breakdown voltage of an original PN junction is equivalently increased. However, this design also causes a specific problem: Lateral diffusion of the depletion region 204 is aggravated. It is possible that the depletion region 204 keeps diffusing to a cutoff ring 206, as shown in FIG. 4, causing an increase of a leakage current, and reducing reliability of the power device.

Figure 5:
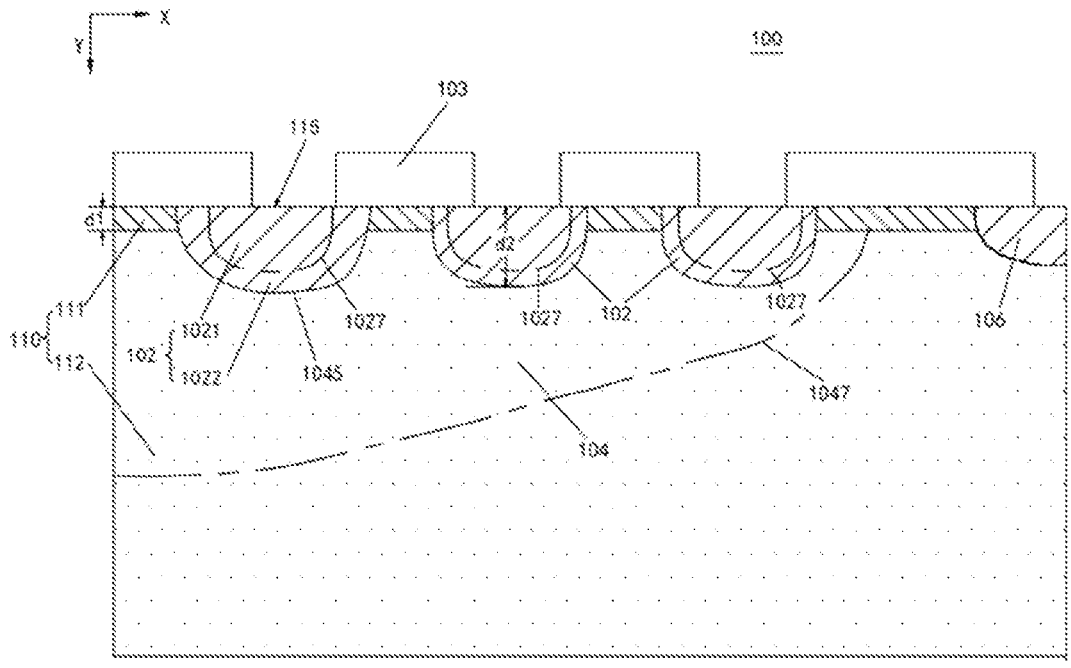
FIG. 5 is a schematic diagram of a structure of a terminal structure of a power device according to an embodiment of the present disclosure.

For the foregoing problem, as shown in FIG. 5, the present disclosure provides a terminal structure 100 of a power device. The terminal structure 100 includes a substrate 110 and a plurality of field limiting rings 102 disposed on a first surface 115 of the substrate 110. The substrate 110 is a semiconductor material carrying conducting ions. The field limiting rings 102 disposed on the first surface 115 are formed through ion implantation on the first surface 115. It should be noted that a conductivity type of implanted ions of the field limiting rings 102 herein is different from a conductivity type of ions in the substrate 110, and an objective is to make the field limiting rings 102 and the substrate 110 form a PN junction, as shown in FIG. 1 and FIG. 2. The substrate 110 includes a drift layer 112 and a doped layer 111. The doped layer 111 is formed through diffusion inward from the first surface 115 of the substrate 110. To be specific, the substrate 110 is a two-layer structure, a layer structure close to the first surface 115 is the doped layer 111, and a layer structure away from the first surface 115 is the drift layer 112. It should be noted that a similarity between the drift layer 112 and the doped layer 111 lies in that both belong to a first conductivity type (have a same conductivity type), and a difference lies in that an impurity concentration of the doped layer 111 is greater than an impurity concentration of the drift layer 112. The field limiting rings 102 belong to a second conductivity type, which is opposite to the conductivity type of the drift layer 112 and the doped layer 111.

The terminal structure 100 may be used in a plurality of types of power devices, for example, a power MOSFET, a fast recovery diode, an IGBT, a reverse-conducting IGBT, a superjunction IGBT, and a superjunction reverse-conducting IGBT. For the power devices, correspondingly, the field limiting rings 102 may be disposed in a design of the terminal structure 100 to increase a breakdown voltage of the power devices (for a specific principle, refer to the foregoing descriptions corresponding to FIG. 3 and FIG. 4). It may be understood that a problem to be resolved by the terminal structure 100 provided in the present disclosure is not how to increase a breakdown voltage of a power device, but essentially how to control lateral diffusion of impurities in the field limiting rings 102. In a conventional design solution, as shown in FIG. 3 and FIG. 4, the terminal structure 200 includes the substrate 210 and the plurality of field limiting rings 202 disposed on the first surface 215 of the substrate 210. Herein, the field limiting rings 202 are designed to diffuse the main junction depletion region 2041 (a region between the depletion boundary 2107 and the depletion boundary 2017 in FIG. 3, that is, a region between dashed lines) of the main junction 201 in the power device, so as to increase a breakdown voltage of the power device. A quantity of field limiting rings 202 is selected based on a specific situation. Usually, a larger quantity of field limiting rings 202 corresponds to a larger diffusion range of the diffused depletion region 204, and correspondingly, the breakdown voltage of the power device also increases. Different from the conventional design, as shown in FIG. 5, the substrate 110 in the present disclosure not only includes the drift layer 112, but also includes the doped layer 111 located on a same side as that of the field limiting rings 102. In the conventional technical solution, the field limiting rings 202 and the drift layer 212 form a PN junction (as shown in FIG. 4). In the solution of the present disclosure, the field limiting rings 102, the drift layer 112, and the doped layer 111 jointly form a PN junction (as shown in FIG. 5).

It should be noted that, in the present disclosure, a conductivity type of the doped layer 111 is the same as a conductivity type of the drift layer 112, and is opposite to a conductivity type of the field limiting rings 102, and an impurity concentration of the doped layer 111 is greater than an impurity concentration of the drift layer 112. For ease of understanding, an N-type substrate 110 is used for description herein. The N-type substrate 110 is usually obtained by doping a silicon semiconductor material with a pentavalent element (phosphorus, arsenic, antimony, or the like), to obtain a semiconductor that conducts electricity mainly by using electrons carrying negative charges. A plurality of field limiting rings 102 are further disposed on a first surface 115 of the N-type substrate 110. A design of the field limiting rings 102 may be simply understood as ion implantation. In an embodiment, in this embodiment, ions are implanted at locations, on the first surface 115 of the N-type substrate 110, at which the field limiting rings 102 need to be disposed. It should be noted that, in this case, the implanted ions are a trivalent element (boron or aluminum), and correspondingly, P-type field limiting rings 102 are formed. In addition, the N-type substrate 110 in the present disclosure includes a drift layer 112 and a doped layer 111 that have different impurity concentrations, where an impurity concentration (i.e., a concentration of ions such as phosphorus, arsenic, or antimony) of the doped layer 111 is greater than an impurity concentration (i.e., a concentration of ions such as phosphorus, arsenic, or antimony) of the drift layer 112. It may be understood that a key point of the solution of the present disclosure is a design of the doped layer 111. With the design of the doped layer 111, a concentration of N-type impurities in a region, on the substrate 110, that is close to the first surface 115 is increased, thereby inhibiting lateral diffusion (diffusion in an X direction) of corresponding impurities in the P-type field limiting rings 102, and helping reduce a lateral size of the terminal structure 100 in the case of a same breakdown voltage.

The N-type substrate 110 and the P-type field limiting rings 102 are used as examples below to describe an effect of inhibiting, by the N-type doped layer 111, lateral diffusion of impurities in the P-type field limiting rings 102. As shown in FIG. 5, when a specific reversed bias voltage is applied, the P-type field limiting rings 102 and the N-type substrate 110 (including the doped layer 111 and the drift layer 112) form a typical PN junction. For ease of understanding, a function of the doped layer 111 is not considered herein, that is, the N-type substrate 110 is considered as an N-type drift layer 112. In this case, the formed PN junction includes the P-type field limiting rings 102 and the N-type drift layer 112.

Figure 6:
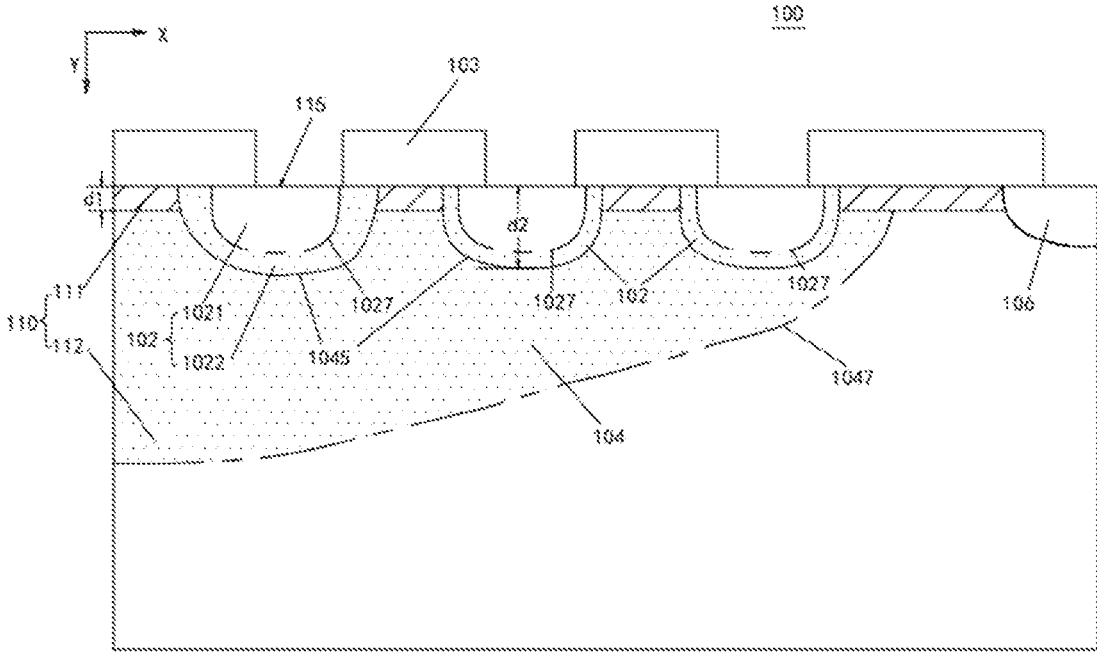
FIG. 6 is a schematic diagram of distribution of a depletion region of a terminal structure of a power device according to an embodiment of the present disclosure.

As shown in FIG. 6, a depletion region 104 is a region between field limiting ring depletion lines 1027 and a drift layer depletion line 1047 (i.e., a dotted shadow region in FIG. 6). A part of the region is the P-type field limiting rings 102 (regions between boundary lines 1045 and the field limiting ring depletion lines 1027), and a part of the region is the N-type drift layer 112 (a region between the boundary lines 1045 and the drift layer depletion line 1047). The solution of the present disclosure includes the N-type doped layer 111 whose impurity concentration is greater than that of the N-type drift layer 112, and this equilibrium changes.

In the present disclosure, because the N-type doped layer 111 is disposed only in a region close to the first surface 115, it may be understood that the N-type doped layer 111 limits only a depletion region 104 near the first surface 115. The following describes ion diffusion. From a macro perspective, a majority carrier (an electron or a hole) in a semiconductor diffuses from a region with a higher concentration to a region with a lower concentration. In the P-type field limiting rings, a region with a highest impurity concentration is also closest to the first surface 115. It may be understood that, when P-type ions are implanted into the first surface 115, the P-type ions diffuse around due to a concentration difference, and the P-type ions diffuse outward in two major diffusion directions: a vertical direction Y away from the first surface 115, and a lateral direction X parallel to the first surface 115. However, in the present disclosure, the N-type doped layer 111 close to the first surface 115 is added. It can be learned from FIG. 5 that, in a region close to the first surface 115, the boundary lines 1045 between the N-type doped layer 111 and the P-type field limiting rings 102 are along the vertical direction Y, and correspondingly, a direction of impurity diffusion between the N-type doped layer 111 and the P-type field limiting rings 102 is perpendicular to the boundary lines 1045, that is, the lateral direction X. Therefore, limitation imposed by the N-type doped layer 111 on the field limiting rings 102 is mainly applied to diffusion of impurities in the lateral direction X, that is, the design of the N-type doped layer 111 can inhibit diffusion of impurities in the P-type field limiting rings 102 in the lateral direction X.

Figure 7:
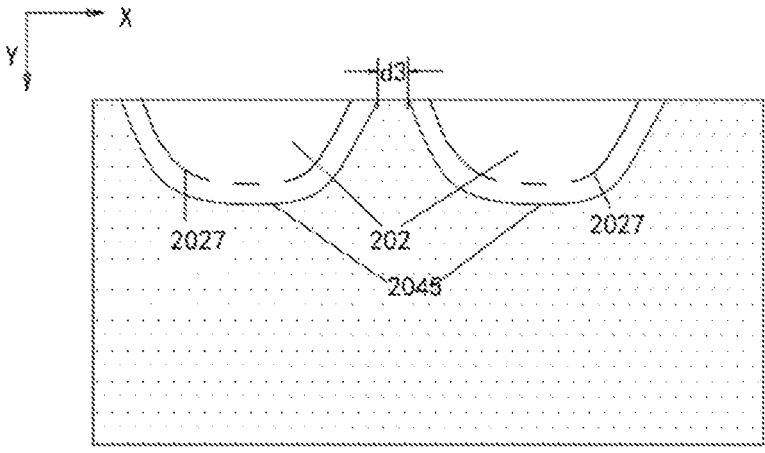
FIG. 7 is a schematic diagram of a structure of field limiting rings in a terminal structure of a power device in the conventional technology.
Figure 8:
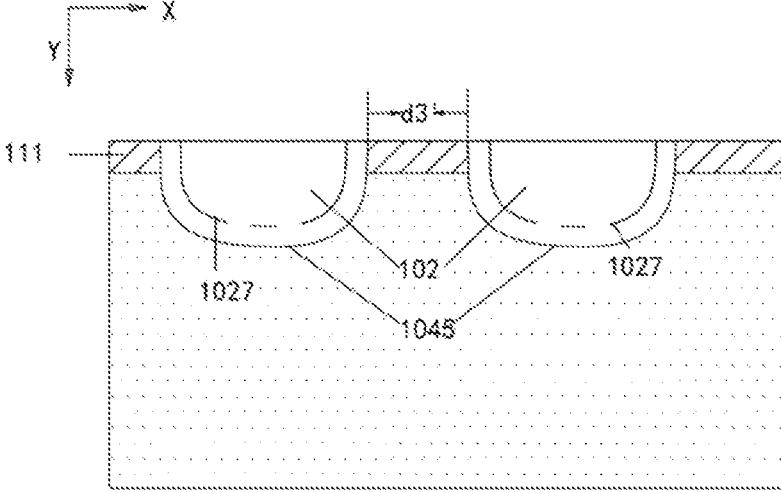
FIG. 8 is a schematic diagram of a structure of field limiting rings in a terminal structure of a power device according to an embodiment of the present disclosure.

For ease of describing a difference after the doped layer 111 is added, refer to FIG. 7 and FIG. 8. FIG. 7 is a schematic diagram of a structure of field limiting rings 102 when no doped layer 111 is disposed, and FIG. 8 is a schematic diagram of a structure of field limiting rings 102 after a doped layer 111 is added. As shown in FIG. 7, boundary lines 2045 of two adjacent P-type field limiting rings 202 are close to the first surface 115. In this case, a distance between the boundary lines 2045 of the two P-type field limiting rings 202 is d3, that is, a distance between two adjacent field limiting rings 202 is d3. As shown in FIG. 8, due to design of the doped layer 111, lateral diffusion of impurities in the P-type field limiting ring 102 close to the area of the first surface 115 is inhibited, and a boundary line

1045 of two adjacent P-type field limiting rings 102 is close to the first surface 115. Correspondingly, in this case, a distance d3' between the adjacent P-type field limiting rings 102 may be reduced. By comparing boundary lines 1045 (2045) corresponding to field limiting rings 102 (202) and distance d3' (d3) between adjacent field limiting rings 102 (202) in two cases shown in FIG. 7 and FIG. 8, it can be learned that after the doped layer 111 is added, a distance between adjacent field limiting rings 102 can be effectively reduced, thereby ensuring that a size of the terminal structure 100 is reduced in the case of a same withstanding voltage, and finally reducing costs of a chip.

It can be learned from the foregoing analysis that the design of the doped layer 111 inhibits lateral diffusion of impurities in the field limiting rings 102, thereby facilitating a miniaturization design of a product. However, in the present disclosure, the doped layer 111 can further overcome impact of charges induced by external charges on the first surface 115 of the substrate 110, thereby improving reliability of the terminal structure 100.

Figure 9:
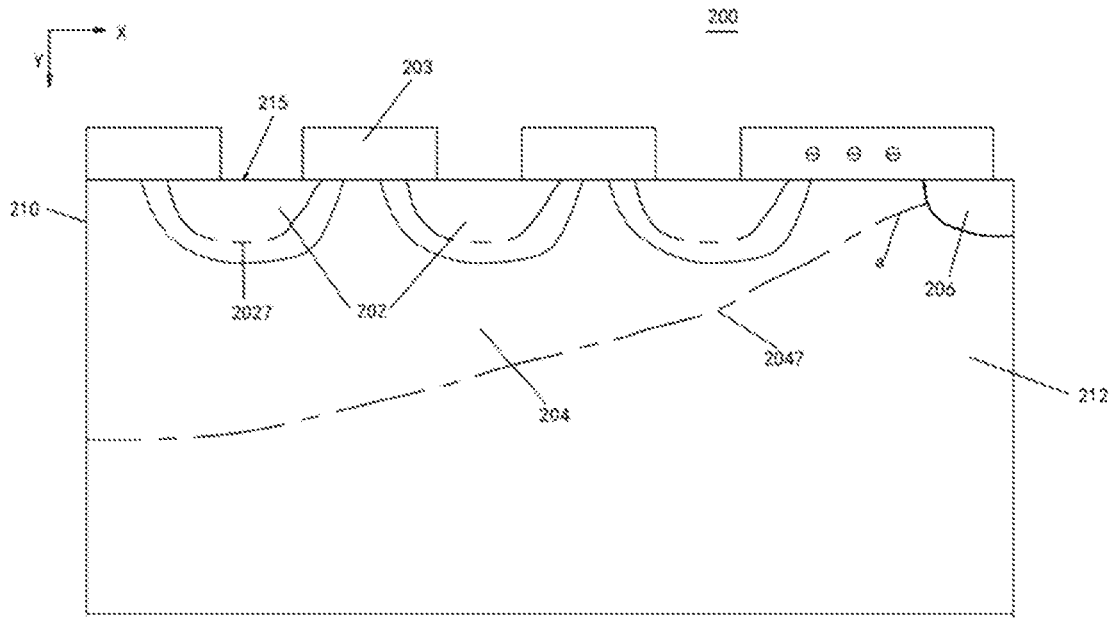
FIG. 9 is a diagram of distribution of depletion lines of a terminal structure of a power device under the action of external charges in the conventional technology.
Figure 10:
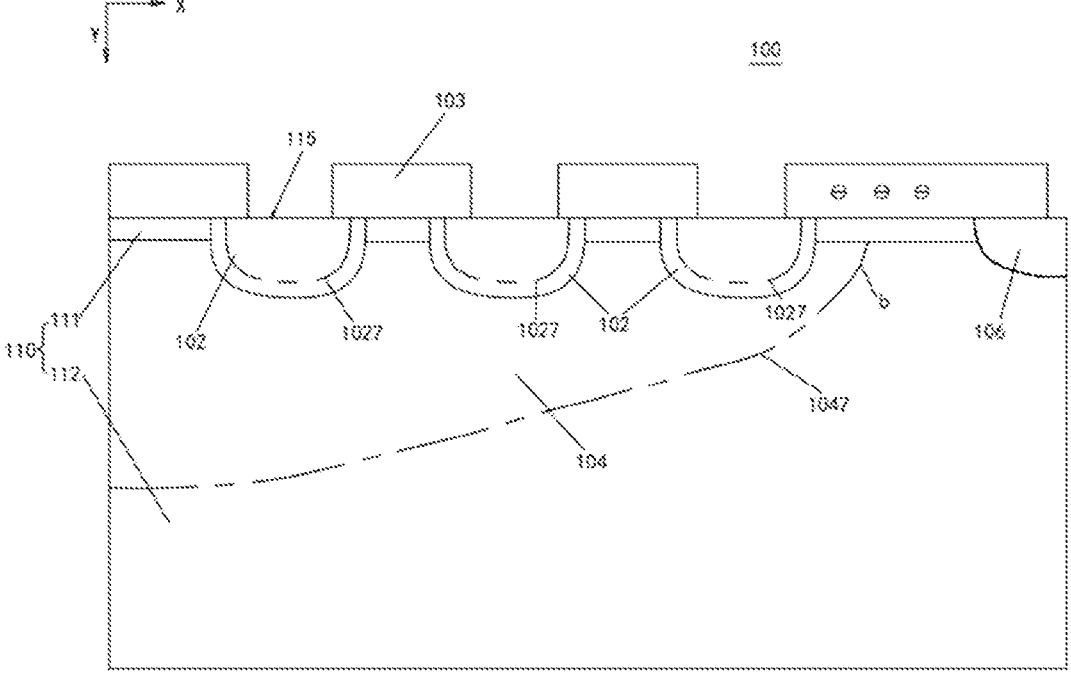
FIG. 10 is a diagram of distribution of depletion lines of a terminal structure of a power device under the action of external charges according to an embodiment of the present disclosure.

A specific embodiment is used below for description. FIG. 9 shows a terminal structure 200 without a doped layer, and FIG. 10 shows a terminal structure 100 with a doped layer 111. As shown in FIG. 9, an oxide layer 203 is disposed on a first surface 215 of a substrate 210. The oxide layer 203 carries negative charges. Therefore, under impact of the negative charges, a line segment a, of a depletion line 2047 of a drift layer 212, that is close to the first surface 215 extends to a cutoff ring 206. That is, external negative charges induce positive charges on the first surface 115, to form an inversion layer. The inversion layer causes further extension of the depletion line 2047, and the depletion line 2047 even extends to an edge of the cutoff ring 106 or a chip, causing an excessively large leakage current and reducing reliability of a power device. However, in the terminal structure 100 shown in FIG. 10, the doped layer 111 is disposed, and inhibits lateral diffusion of impurities, thereby preventing a line segment b, of a depletion line 1047, that is close to a first surface 115 from extending to a cutoff ring 106. This avoids an excessively large leakage current, greatly reduces impact of external charges on lateral diffusion of a depletion region 104, and improves reliability of a power device.

Further, in a specific embodiment, as shown in FIG. 5, an impurity concentration of the doped layer 111 is less than an impurity concentration of the field limiting rings 102. For ease of understanding, an implementation of the N-type substrate 110 is used for description herein. When the substrate 110 is an N-type substrate, corresponding field limiting rings 102 belong to a P-type, an impurity concentration of the field limiting rings 102 is a concentration of trivalent boron or aluminum ions, a corresponding doped layer 111 and drift layer 112 belong to an N-type, and impurity concentrations of the doped layer 111 and the drift layer 112 are concentrations of pentavalent phosphorus, arsenic, or antimony ions. In this embodiment, the design of the doped layer 111 in the substrate 110 is merely intended to inhibit lateral diffusion of impurities in the field limiting rings 102, but not to avoid lateral diffusion of impurities in the field limiting rings 102. Therefore, an impurity concentration of the N-type doped layer 111 needs to be less than an impurity concentration of the P-type field limiting rings 102. The field limiting rings 102 are formed through ion implantation in a region in which the doped layer 111 is located. Therefore, to effectively form the field limiting rings 102, the impurity concentration of the doped layer 111 needs to be less than the impurity concentration of the field limiting rings 102.

In a specific embodiment, as shown in FIG. 5, the impurity concentration of the doped layer 111 is $10^{13}$ to $10^{15}/cm^3$. In this embodiment, if the impurity concentration of the doped layer 111 is less than $10^{13}/cm^3$, an effect of inhibiting, by the doped layer 111, lateral diffusion of impurities in the field limiting rings 102 is weakened, or even can be ignored. In this case, a design objective of the present disclosure cannot be achieved.

Specifically, as shown in FIG. 5, a junction depth d1 of the doped layer 111 is less than a junction depth d2 of the field limiting rings 102. The junction depth is a distance between the first surface 115 of the semiconductor and a location, in the depletion region 104, at which an impurity concentration is equal to an impurity concentration of the substrate 110. It may be understood that the junction depth d1 of the doped layer 111 is a thickness from the first surface 115 to the boundary line 1045 between the doped layer 111 and the drift layer 112. Beyond this thickness, an impurity concentration changes to the impurity concentration of the drift layer 112 in the substrate 110. The junction depth d2 of the field limiting rings 102 may be understood as follows: During manufacturing of the field limiting rings 102, ions are implanted into the substrate 110 from the first surface 115 and then diffuse at a specific high temperature. Therefore, in the depletion region 104 corresponding to the field limiting rings 102, a larger distance from the first surface 115 indicates a lower impurity concentration (diffusion is performed from a region with a higher concentration to a region with a lower concentration). When a corresponding impurity concentration decreases to be the same as an impurity concentration of the substrate, it may be understood that a distance from the first surface herein is the junction depth of the field limiting rings. When a corresponding impurity concentration decreases to be the same as the impurity concentration of the substrate 110, it may be understood that a distance from the first surface 115 herein is the junction depth d2 of the field limiting rings 102. Therefore, in this embodiment, the junction depth d1 of the doped layer 111 is less than the junction depth d2 of the field limiting rings 102, so that a depth of the field limiting rings 102 in a direction away from the first surface 115 is greater than a depth of the doped layer 111. In this way, the design of the doped layer 111 does not affect vertical diffusion (in the Y direction) of the depletion region 104 corresponding to the field limiting rings 102. In the solution of the present disclosure, the doped layer 111 is used to inhibit lateral diffusion (in the X direction) of the depletion region 104. However, vertical diffusion of the depletion region 104 does not need to be limited by the doped layer 111. Therefore, the junction depth d2 of the field limiting rings 102 needs to be greater than the junction depth d1 of the doped layer 111 herein, to prevent the doped layer 111 from hindering connection between depletion regions 104 corresponding to adjacent field limiting rings 102 and further affecting a breakdown voltage.

In an embodiment, a range of the junction depth d1 of the doped layer 111 is 3 μm to 5 μm, and a range of the junction depth d2 of the field limiting rings 102 is 5 μm to 15 μm. In this embodiment, the selection of the ranges of the junction depths of the doped layer 111 and the field limiting rings 102 enables the doped layer 111 to limit lateral diffusion of impurities in the field limiting rings 102, and also prevents the doped layer 111 from limiting vertical diffusion of impurities in the field limiting rings 102.

As shown in FIG. 5, in a specific embodiment, the terminal structure 100 further includes a field oxide layer 103. The field oxide layer 103 is disposed on the first surface 115, and the field limiting rings 102 are connected to the field oxide layer 103. In this embodiment, an objective of disposing the field oxide layer 103 on the first surface 115 is to form an isolating layer. The field oxide layer 103 is formed on the substrate 110 to isolate a semiconductor device, and a thickness of the field oxide layer is usually large, to shield a surface leakage current of the terminal structure 100, thereby preventing a performance failure of the power device caused by the surface leakage current.

As shown in FIG. 11, the terminal structure 100 further includes a field plate 150, and the field plate 150 is disposed on a side, of the field oxide layer 103, that is away from the first surface 115. In this embodiment, the field plate 150 is disposed on the side, of the field oxide layer 103, that is away from the first surface 115. When a PN junction formed by the substrate 110 and the field limiting rings 102 in the terminal structure 100 is reverse-biased, a new electric field peak value is introduced at an end of the field plate, to weaken a main junction electric field, and increase a breakdown voltage of the terminal structure. In an embodiment, the field plate 150 may be a composite field plate structure of a metal field plate 151 and a polycrystalline silicon field plate 152.

As shown in FIG. 5, the terminal structure 100 in this embodiment further includes a cutoff ring 106 of the first conductivity type, and the cutoff ring 106 is located at an outer edge of the substrate 110. In this embodiment, the cutoff ring 106 is disposed at the outer edge of the substrate 110, to avoid inversion on a surface of the terminal structure 100. During manufacturing and packaging of the power device, the oxide layer 103 on the first surface 115 of the substrate 110 is likely to produce or introduce surface charges (including fixed charges and movable charges). When a quantity of surface charges reaches a specific value, an inversion layer may be formed on the first surface 115 of the substrate 110, causing an excessively large leakage current at an edge of a chip, and seriously affecting performance of the device, or even causing a failure of the device.

As shown in FIG. 5, the terminal structure 100 provided in the foregoing embodiment includes the substrate 110 (the drift layer 112 and the doped layer 111) and the field limiting rings 102. Through ion implantation on the first surface 115 of the substrate 110, semiconductor structures of different conductivity types and concentrations are implemented, to form a PN junction that meets a requirement. In an embodiment, there are two conductivity types herein. One conductivity type is the N-type, that is, a conducting carrier is a free electron. The other conductivity type is the P-type, that is, a conducting carrier is a hole (a positive charge). The two different conductivity types are formed because different elements are implanted. The substrate 110 is used as an example. If the substrate 110 is an N-type substrate, the substrate is doped with a pentavalent phosphorus, arsenic, or antimony element, and in this case, a majority carrier in the N-type substrate 110 is an electron. If the substrate 110 is a P-type substrate, the substrate is doped with a trivalent boron, indium, or aluminum element, and in this case, a majority carrier in the P-type substrate 110 is a hole. It may be understood that selection of a specific type of a carrier in the substrate 110, the field limiting rings 102, and another structure is not limited in the technical solution of the present disclosure. In the technical solution, an N-type substrate 110 may be combined with P-type field limiting rings 102, or a P-type substrate 110 may be combined with N-type field limiting rings 102. A specific solution may be selected according to an actual requirement.

The terminal structure of a power device in the present disclosure is different from a conventional terminal structure. Therefore, a manufacturing method is also different from a conventional manufacturing method. The following describes in detail a manufacturing method for the terminal structure of a power device in the present disclosure.

FIG. 12 is a flowchart of a manufacturing method for a terminal structure of a power device according to the present disclosure. The method specifically includes the following steps.

Step S10: Provide a substrate of a first conductivity type, where the substrate includes a drift layer. In this step, a substrate with a specific thickness and resistivity, for example, a monocrystalline silicon float-zone (FZ) substrate, is selected first.

Step S20: Implant and drive in ions of the first conductivity type on a first surface of the substrate, to convert a part of the drift layer into a doped layer of the first conductivity type.

It should be noted that the ion implantation performed herein is doping a semiconductor with impurities, where there are a plurality of types of impurities. For example, a semiconductor material is doped with acceptor impurities (e.g., a group-III element in a periodic table of elements, such as boron), so that the acceptor impurities replace silicon atoms in a lattice, to form a P-type semiconductor. Alternatively, a semiconductor material is doped with donor impurities (e.g., a group-V element in the periodic table of elements, such as phosphorus or arsenic), so that the donor impurities replace silicon atoms in a lattice, to form an N-type semiconductor. Parameters such as implantation energy and an implantation dose during doping may be controlled to obtain semiconductor materials with different indexes.

Step S30: Implant and drive in ions of a second conductivity type in a coverage area of the doped layer, to form a plurality of field limiting rings of the second conductivity type. A quantity and a shape of field limiting rings may be set according to an actual requirement. For example, 2 to 20 field limiting rings may be disposed according to a withstanding voltage requirement of a device.

Figure 13:
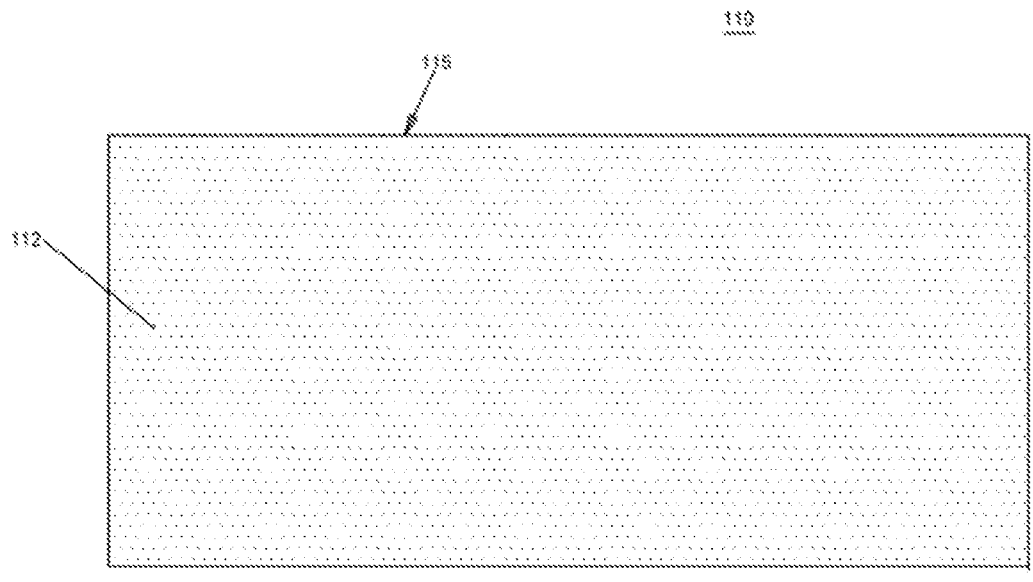
FIG. 13 is a schematic diagram of step S10 in a manufacturing method for a terminal structure of a power device according to an embodiment of the present disclosure.
Figure 14:
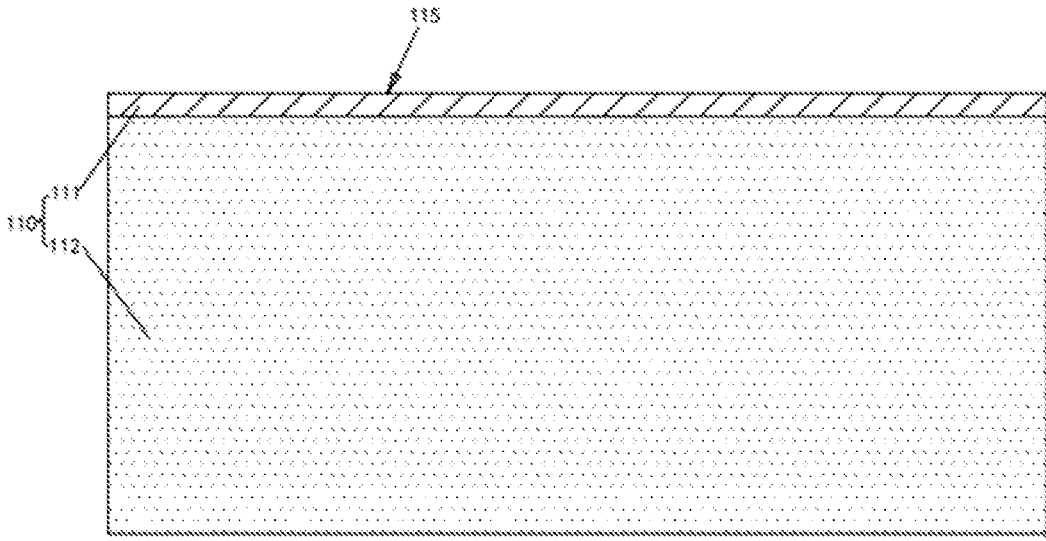
FIG. 14 is a schematic diagram of step S20 in a manufacturing method for a terminal structure of a power device according to an embodiment of the present disclosure.

A difference between the manufacturing method for a terminal structure in the present disclosure and a conventional manufacturing process lies in manufacturing of a doped layer. As shown in FIG. 13 to FIG. 15, in the manufacturing method in the present disclosure, a substrate 110 of a conductivity type with a proper conductivity is first selected. It may be understood that the substrate is a drift layer 112. As shown in FIG. 14, conducting ions of a same type are then implanted and driven-in on a first surface 115 of the substrate 110 again. By implanting the conducting ions of the same type, a concentration of conducting ions in a drift layer 112, in the substrate 110, that is close to the first surface 115 is increased, to form a doped layer 111. It may be understood that the ion implantation makes an impurity concentration of the doped layer 111 greater than an impurity concentration of a drift layer 112 that is away from the first surface 115. As shown in FIG. 15, finally, through the second-time ion implantation, conducting ions of different types are implanted and driven-in in a required region on the first surface 115, to form field limiting rings 102 that extend from the first surface 115 to the drift layer 112. It may be understood that the second-time implantation of different types of conducting ions is a process performed after the doped layer 111 is formed, that is, proper locations are selected on the doped layer 111 for manufacturing the field limiting rings 102. Compared with conventional manufacturing, in the solution of the present disclosure, before processing of the field limiting rings 102, ions are implanted into a drift layer 112 in a region near the first surface 115, so that the drift layer 112 in the region is converted into a doped layer 111 with a higher doping concentration. In this way, in a subsequent manufacturing process of the field limiting rings 102, an implantation process of the field limiting rings 102 starts from the doped layer 111, and diffusion is also performed from the doped layer 111 to the drift layer 112 during diffusion and drive-in of conducting ions of the field limiting rings. Because an impurity concentration of the doped layer 111 is greater than an impurity concentration of the drift layer 112, implantation and drive-in for the field limiting rings 102 are affected to some extent. Specific impact lies in that the doped layer 111 limits lateral diffusion (in an X direction) of impurities in the field limiting rings 102. In the terminal structure 100 obtained by using the foregoing manufacturing method, the doped layer 111 is designed, and therefore lateral diffusion of impurities in the field limiting rings 102 is limited to some extent, thereby reducing a lateral spacing between a plurality of field limiting rings 102. This reduces a size of the terminal structure while ensuring a same breakdown voltage, thereby facilitating a miniaturization design of the power device. In addition, the design of the doped layer 111 can further reduce impact of negative charges near the first surface 115 on depletion in a drift region, and improve reliability of the terminal structure 100.

It should be noted that the first conductivity type mentioned in the foregoing manufacturing method for a terminal structure may be an N-type, and correspondingly, the second conductivity type is a P-type; or on the contrary, the first conductivity type may be a P-type, and correspondingly, the second conductivity type is an N-type.

In step S20, implantation energy for forming the doped layer is 1 keV to 2000 keV, an implantation dose is $10^{11}$ to $10^{14}$ atoms/cm$^2$, and a drive-in temperature is 900° C. to 1150° C. In this embodiment, the implantation energy for the doped layer is 1 keV to 2000 keV, the implantation dose is $10^{11}$ to $10^{14}$ atoms/cm$^2$, and the drive-in temperature is 900° C. to 1150° C. This can ensure that the impurity concentration of the doped layer is $10^{13}$/cm$^3$ to $10^{15}$/cm$^3$.

In step S20 and step S30, it should be noted that a junction depth of the field limiting rings is greater than a junction depth of a lightly doped layer of the first conductivity type. In an embodiment, a range of the junction depth of the doped layer is 3 μm to 5 μm, and a range of the junction depth of the field limiting rings is 5 μm to 15 μm. In this embodiment, the junction depth of the doped layer is less than the junction depth of the field limiting rings, so that a depth of the field limiting rings in a direction away from the first surface is greater than a depth of the doped layer. In this way, the design of the doped layer does not affect vertical diffusion of a depletion region corresponding to the field limiting rings. In the solution of the present disclosure, the doped layer is used to inhibit lateral diffusion of the depletion region corresponding to the field limiting rings. However, vertical diffusion (in a direction away from the first surface) of the depletion region does not need to be limited by the doped layer. Therefore, a vertical depth of the field limiting rings needs to be greater than a vertical depth of the doped layer herein.

In a specific embodiment, as shown in FIG. 16, the manufacturing method for a terminal structure of a power device further includes the following steps:

Step S40: Dispose a field oxide layer on the first surface, form a cutoff ring of the first conductivity type on an outermost side of the substrate, and dispose a field plate on a side, of the field oxide layer, that is away from the first surface.

In this embodiment, the field oxide layer, the cutoff ring, and the field plate are further disposed on the substrate. These structures are designed to increase a withstanding voltage of the terminal structure and avoid an excessively large leakage current of the terminal structure.

In an embodiment, the field oxide layer may be manufactured by using a field oxide (FOX) process, and is located above the plurality of field limiting rings of the second conductivity type and the doped layer. In another embodiment, the field oxide layer may be manufactured by using a local oxidation of silicon (LOCOS) process, and is located between field limiting rings.

According to the foregoing manufacturing method, an N-type IGBT power device is used as an example. In the terminal structure of a power device and the manufacturing method that are provided in the present disclosure, before preparation of P-type floating field limiting ring, N-type implantation is performed first, to introduce an N-type doped layer into a first surface. This has the following two beneficial effects: A length of lateral diffusion on a surface of the P-type floating field limiting rings is reduced, thereby increasing an effective voltage withstand area of the surface of the floating field limiting rings, reducing a length of a terminal in the case of a same voltage withstand capability, and reducing costs of a chip. In addition, a lightly doped N-type layer is introduced into a surface of the terminal, so that it is more difficult for negative charges to induce positive charges on a Si surface, thereby preventing a depletion line of a drift region from diffusing to an edge of the chip due to the negative charges, and improving reliability of the chip.

Figure 17:
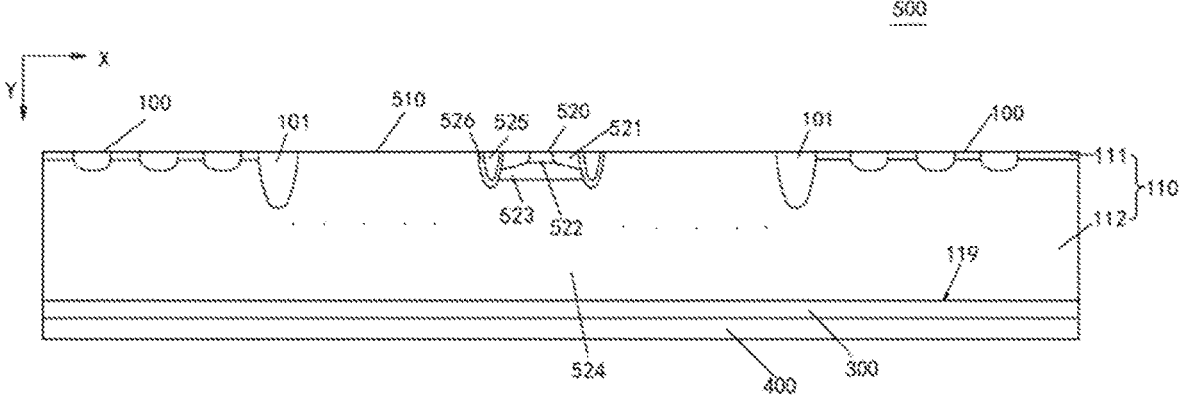
FIG. 17 is a schematic diagram of a structure of an IGBT as a power device according to an embodiment of the present disclosure.

As shown in FIG. 17, the present disclosure further provides a power device 500. The power device 500 includes a collector layer 400 and/or a buffer layer 300, and the terminal structure 100 provided in the foregoing embodiment. The collector layer 400 and/or the buffer layer 300 are located on a second surface 119 of a substrate 110. It may be understood that, in the power device 500 in which the terminal structure 100 provided in the present disclosure is used, a doped layer 111 is designed on the substrate 110, and therefore lateral diffusion of impurities in field limiting rings 102 can be effectively limited, and a design size of the terminal structure can still be effectively reduced when a bias voltage is high, thereby reducing a design size of the power device 500, and improving reliability of the power device. It may be understood that a power device in which the terminal structure in the present disclosure may be used includes a power MOSFET, a fast recovery diode, an IGBT, a reverse-conducting IGBT, a superjunction IGBT, a superjunction reverse-conducting IGBT, and the like.

Application of the terminal structure provided in the present disclosure in a power device is described below by using an example in which the power device 500 is an IGBT.

FIG. 17 is a schematic cross-sectional view of the IGBT. The power device 500 (IGBT) includes a cell region 510 and a terminal structure 100 disposed on an outer side of the cell region 510. A main junction 101 in the terminal structure 100 is connected to the cell region 510. A huge quantity of cells 520 is arranged in the cell region 510. The cells 520 include an N+ emitter region 521, a P+ contact 522, a P-body region 523, a drift region 524, a gate polycrystalline silicon 525 surrounded by a gate oxide layer 526, a buffer layer 300, and a collector layer 400. It may be understood that the drift region 524 in the cells 520 is connected to a drift layer 112 in the terminal structure 100; a side, of the cell region 510, that is away from the N+ emitter region 521, and a side, of the terminal structure 100, that is away from a doped layer 111 each include a buffer layer 300 and a collector layer 400; and buffer layers 300 and collector layers 400 that are located in different regions are connected to each other.

During use, electrodes of the power device 500 include an emitter, a gate, and a collector. The N+ emitter region 521 and the P+ contact 522 are connected to the emitter. The gate polycrystalline silicon 525 is connected to the gate. An N-type buffer layer 300 and a P-type collector layer 400 are disposed on a rear side (a side away from the N+ emitter region 521) of the cells 520, where the P-type collector layer is connected to the collector. When the collector of the power device 500 is connected to a positive voltage, a corresponding emitter and gate are grounded, and a potential of field limiting rings 102 in a corresponding terminal structure 100 is floating. In this case, a forward breakdown voltage of the power device 500 is implemented through the design the field limiting rings 102 in the terminal structure 100. Further, the doped layer 111 is designed in the terminal structure 100. Therefore, a spacing between adjacent field limiting rings 102 is reduced, thereby implementing a miniaturization design of the terminal structure 100, and reducing costs of a chip. In addition, impact of external charges on the terminal structure 100 is reduced, thereby improving reliability of the power device 500.

It may be understood that the buffer layer 300 in this embodiment may also be understood as a field cutoff layer, and is configured to cut off an electric field. In the case of a same breakdown voltage, the power device 500 provided with the buffer layer 300 has a thinner substrate, thereby achieving a smaller conduction voltage drop and a smaller switching loss. The collector layer 400 herein is configured to provide hole injection, and is electrically connected to the collector.

The foregoing descriptions are basic principles, main features, and advantages of the present disclosure. A person skilled in the art should understand that the present disclosure is not limited to the foregoing embodiments, and various changes and improvements may be made to the present disclosure without departing from the spirit or scope of the present disclosure. These changes and improvements shall fall within the protection scope claimed in the present disclosure. The protection scope claimed in the present disclosure is defined by the appended claims and equivalents thereof. The foregoing disclosure is merely specific embodiments of the present disclosure, but the present disclosure is not limited thereto. A person skilled in the art may make various modifications and variations to the present disclosure without departing from the spirit and scope of the present disclosure. It is clear that these modifications and variations shall fall within the protection scope claimed in the present disclosure. In addition, although some specific terms are used in this specification, these terms are merely used for ease of description and do not constitute any limitation on the present disclosure.

What is claimed is:

1. A terminal structure of a power device, wherein the terminal structure comprises:

a substrate comprising a drift layer and a doped layer, wherein the doped layer is diffused inward from a first surface of the substrate and is disposed within a part of the drift layer that is adjacent to the first surface, wherein the doped layer and the drift layer are of a first conductivity type, and wherein a first impurity concentration of the doped layer is greater than a second impurity concentration of the drift layer;

a plurality of field limiting rings disposed on the first surface, wherein the plurality of field limiting rings is a second conductivity type; and a cutoff ring of the first conductivity type, wherein the cutoff ring is located at an outer edge of the substrate.

2. The terminal structure of claim 1, wherein the first impurity concentration is less than a third impurity concentration of the field limiting rings.

3. The terminal structure of claim 2, wherein the first impurity concentration is $10^{13}$ cubic centimeters (cm$^3$) to $10^{15}$ cm$^3$.

4. The terminal structure of claim 1, wherein a first junction depth of the doped layer is less than a second junction depth of the plurality of field limiting rings.

5. The terminal structure of claim 4, wherein a first range of the first junction depth is 3 micrometers (μm) to 5 μm, and wherein a second range of the second junction depth is 5 μm to 15 μm.

6. The terminal structure of claim 1, further comprising a field oxide layer disposed on the first surface and connected to the plurality of field limiting rings.

7. The terminal structure of claim 6, further comprising a field plate disposed on a side of the field oxide layer that is away from the first surface.

8. The terminal structure of claim 1, wherein the first conductivity type is an N type, and the second conductivity type is a P type; or wherein the first conductivity type is a P type, and the second conductivity type is an N type.

9. A power device comprising:

at least one of a collector layer or a buffer layer;

a terminal structure comprising:

a substrate comprising a drift layer and a doped layer, wherein the doped layer is diffused inward from a first surface of the substrate and is disposed within a part of the drift layer that is adjacent to the first surface, wherein the doped layer and the drift layer are of a first conductivity type, wherein a first impurity concentration of the doped layer is greater than a second impurity concentration of the drift layer, wherein the at least one of the collector layer or the buffer layer is disposed on a second surface of the substrate opposite to the first surface;

a plurality of field limiting rings disposed on the first surface, wherein the plurality of field limiting rings is a second conductivity type; and a cutoff ring of the first conductivity type, wherein the cutoff ring is located at an outer edge of the substrate.

10. The power device of claim 9, wherein the first impurity concentration is less than a third impurity concentration of the field limiting rings.

11. The power device of claim 9, wherein the first impurity concentration is $10^{13}$ cubic centimeters (cm$^3$) to $10^{15}$ cm$^3$.

12. The power device of claim 9, wherein a first junction depth of the doped layer is less than a second junction depth of the plurality of field limiting rings.

13. The power device of claim 12, wherein a first range of the first junction depth is 3 micrometers (μm) to 5 μm, and wherein a second range of the second junction depth is 5 μm to 15 μm.

14. A terminal structure of a power device, wherein the terminal structure comprises:

a substrate comprising a drift layer and a doped layer, wherein the doped layer is diffused inward from a first surface of the substrate, is disposed within a part of the drift layer that is adjacent to the first surface, and extends laterally within the drift layer from an inner region of the terminal structure toward an outer edge of the substrate, wherein the doped layer and the drift layer are of a first conductivity type, and wherein a first impurity concentration of the doped layer is greater than a second impurity concentration of the drift layer;

a plurality of field limiting rings disposed on the first surface, wherein the plurality of field limiting rings is a second conductivity type; and a cutoff ring of the first conductivity type, wherein the cutoff ring is located at the outer edge.

15. The terminal structure of claim 14, wherein the first impurity concentration is less than a third impurity concentration of the field limiting rings.

16. The terminal structure of claim 15, wherein the first impurity concentration is $10^{13}$ cubic centimeters (cm$^3$) to $10^{15}$ cm$^3$.

17. The terminal structure of claim 14, wherein a first junction depth of the doped layer is less than a second junction depth of the plurality of field limiting rings.

18. The terminal structure of claim 17, wherein a first range of the first junction depth is 3 micrometers (μm) to 5 μm, and wherein a second range of the second junction depth is 5 μm to 15 μm.

19. The terminal structure of claim 14, further comprising a field oxide layer disposed on the first surface and connected to the plurality of field limiting rings.

20. The terminal structure of claim 19, further comprising a field plate disposed on a side of the field oxide layer that is away from the first surface.

* * * * *